United States Patent
Chu et al.

(10) Patent No.: US 8,685,764 B2
(45) Date of Patent: Apr. 1, 2014

(54) METHOD TO MAKE LOW RESISTANCE CONTACT

(75) Inventors: Chen-Fu Chu, Hsinchu (TW);
Wen-Huang Liu, Guan-Xi Town (TW);
Jiunn-Yi Chu, Chubei (TW);
Chao-Chen Cheng, Hsinchu (TW);
Hao-Chun Cheng, Donggang Township, Pingtung County (TW); Feng-Hsu Fan, Jhonghe (TW); Trung Tri Doan, Baoshan Township (TW)

(73) Assignee: SemiLEDs Optoelectronics Co., Ltd., Miao-Li County (TW)

( * ) Notice: Subject to any disclaimer, the term of this patent is extended or adjusted under 35 U.S.C. 154(b) by 1396 days.

(21) Appl. No.: 11/761,897

(22) Filed: Jun. 12, 2007

(65) Prior Publication Data

US 2008/0035950 A1    Feb. 14, 2008

Related U.S. Application Data

(63) Continuation-in-part of application No. 11/032,882, filed on Jan. 11, 2005, now Pat. No. 7,432,119.

(51) Int. Cl.
*H01L 33/00* (2010.01)
(52) U.S. Cl.
USPC ......... 438/22; 438/98; 438/605; 257/E33.001

(58) Field of Classification Search
USPC ................. 438/22–47, 98, 582–605
See application file for complete search history.

(56) References Cited

U.S. PATENT DOCUMENTS

| | | | |
|---|---|---|---|
| 6,172,382 B1 * | 1/2001 | Nagahama et al. | 257/94 |
| 6,365,429 B1 * | 4/2002 | Kneissl et al. | 438/46 |
| 6,448,102 B1 * | 9/2002 | Kneissl et al. | 438/46 |
| 6,555,405 B2 * | 4/2003 | Chen et al. | 438/22 |
| 2004/0166599 A1 | 8/2004 | Ishida | |
| 2004/0209402 A1 | 10/2004 | Chai et al. | |
| 2006/0154392 A1 | 7/2006 | Tran et al. | |
| 2007/0121690 A1 * | 5/2007 | Fujii et al. | 372/43.01 |

OTHER PUBLICATIONS

PCT International Search Report and Written Opinion dated Dec. 23, 2009 for PCT Application No. PCT/US08/66378.

* cited by examiner

*Primary Examiner* — Savitr Mulpuri
(74) *Attorney, Agent, or Firm* — Patterson & Sheridan, L.L.P.

(57) ABSTRACT

Techniques for fabricating contacts on inverted configuration surfaces of GaN layers of semiconductor devices are provided. An n-doped GaN layer may be formed with a surface exposed by removing a substrate on which the n-doped GaN layer was formed. The crystal structure of such a surface may have a significantly different configuration than the surface of an as-deposited p-doped GaN layer.

12 Claims, 8 Drawing Sheets

METHOD TO MAKE LOW RESISTANCE CONTACT

CROSS-REFERENCE TO RELATED APPLICATIONS

This is a continuation-in-part of U.S. patent application Ser. No. 11/032,882, filed Jan. 11, 2005 now U.S. Pat. No. 7,432,119.

BACKGROUND OF THE INVENTION

1. Field of the Invention

Embodiments of the present invention generally relate to semiconductor processing and, more particularly, to forming a conductive contact for interfacing with a semiconductor device.

2. Description of the Related Art

Figure 1:
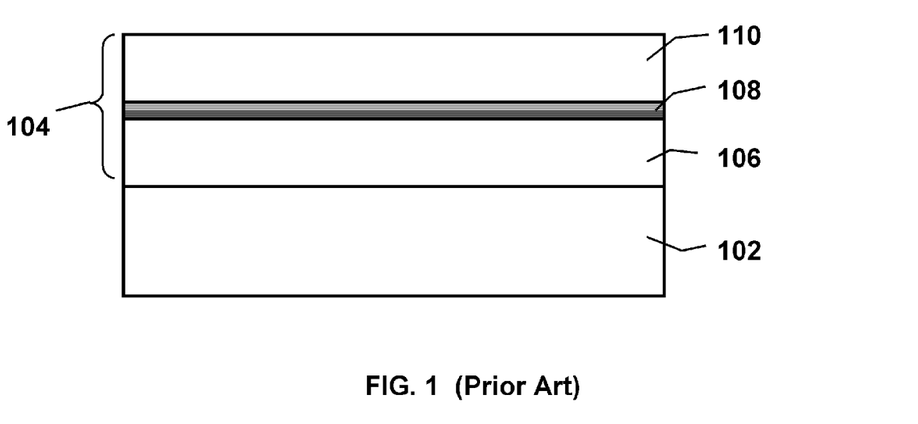
FIG. 1 illustrates an example semiconductor structure with GaN layers.

One or more Layers of Gallium Nitride (GaN) are often deposited when fabricating various types of semiconductor devices. For example, during the fabrication of light emitting diodes (LEDs), an epitaxial structure of an "LED stack" including layers of p-doped GaN (p-GaN) and n-doped GaN (n-GaN) may be formed. FIG. 1 illustrates an example of such a structure 104, having an n-GaN layer 106 and a p-GaN layer 110 separated by a multi-quantum well MQW layer 108. The structure 104 is typically deposited on a substrate 102 of suitable material, such as c-plane SiC, c-plane sapphire.

Figure 2A:
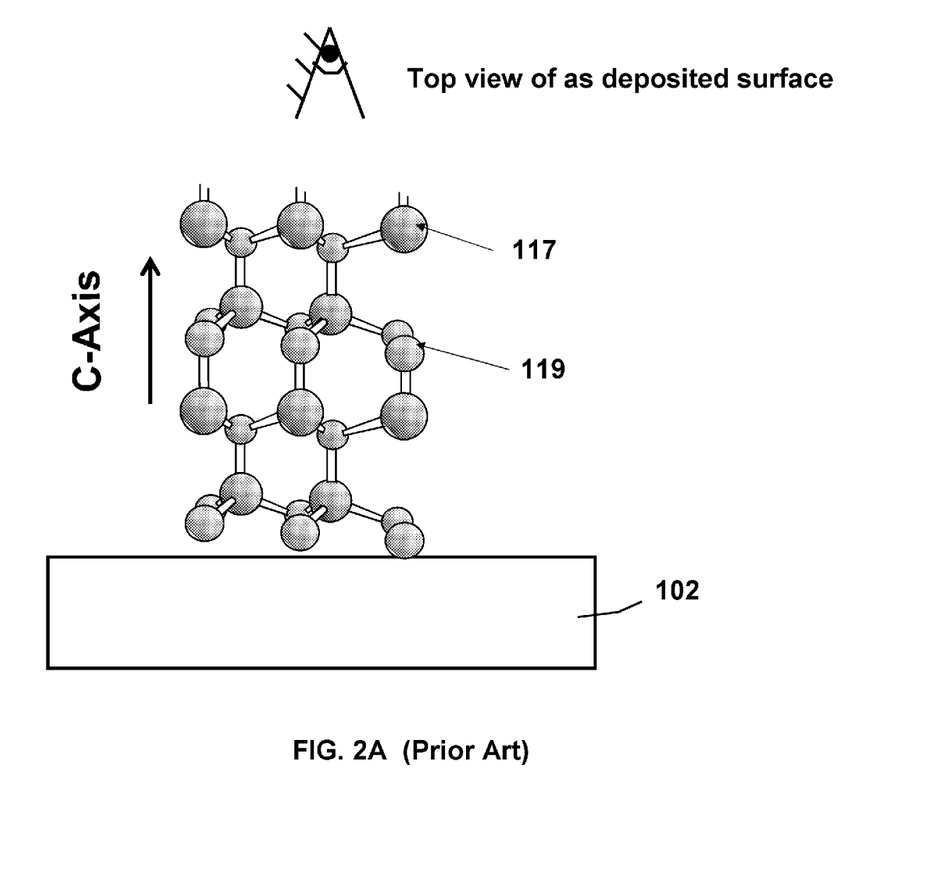
FIG. 2A illustrates an example crystal structure of a as deposited GaN layer.

The deposition may involve gaseous reactions, such as $3GaCl+3NH_3 \rightarrow 3GaN+2H_2+3HCl$ or $TMG+NH_3 \rightarrow GaN+CH_x+H_2$. Such deposition on c-plane SiC, c-plane sapphire typically results in growth of crystalline structure along the c-axis of hexagonal crystal configuration with a surface where atomic bonds between Ga and N has a specific configuration as shown in FIG. 2A. This surface is usually very stable as the atoms normally occupy the lowest free energy states during the deposition process.

Figure 3:
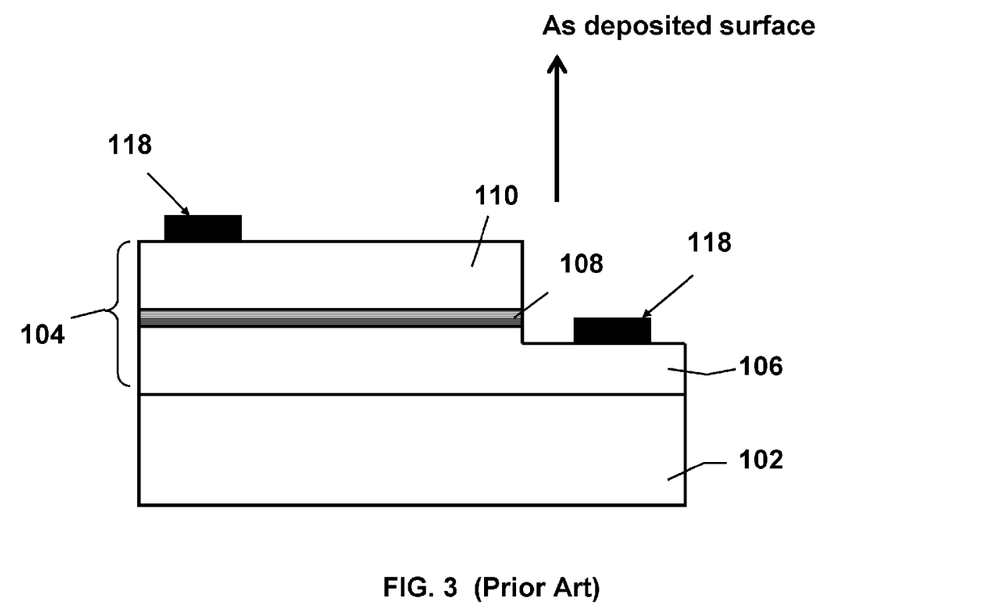
FIG. 3 illustrates the structure of FIG. 1 with contacts formed thereon.

As illustrated in FIG. 3, contacts 118 are typically formed in order to apply a voltage differential across the n-GaN and p-GaN layers to cause the structure 104 to emit light. In conventional LED fabrication processes, the n-pad contact to the n-GaN layer 106 is formed as a metal contact on top of as-deposited n-GaN layer 106. Conventional metal contact structures using Ni, Cr, Ti, and Pt have been used as contact materials for as-deposited surfaces. Specific materials, such as Cr/Au, Ti/Al/Ni/Au, and Ti/Ni/Au have yielded relatively low resistance contact to the n-GaN. Ni/Au and ITO have been used for making ohmic contact to the p-GaN.

Figure 2B:
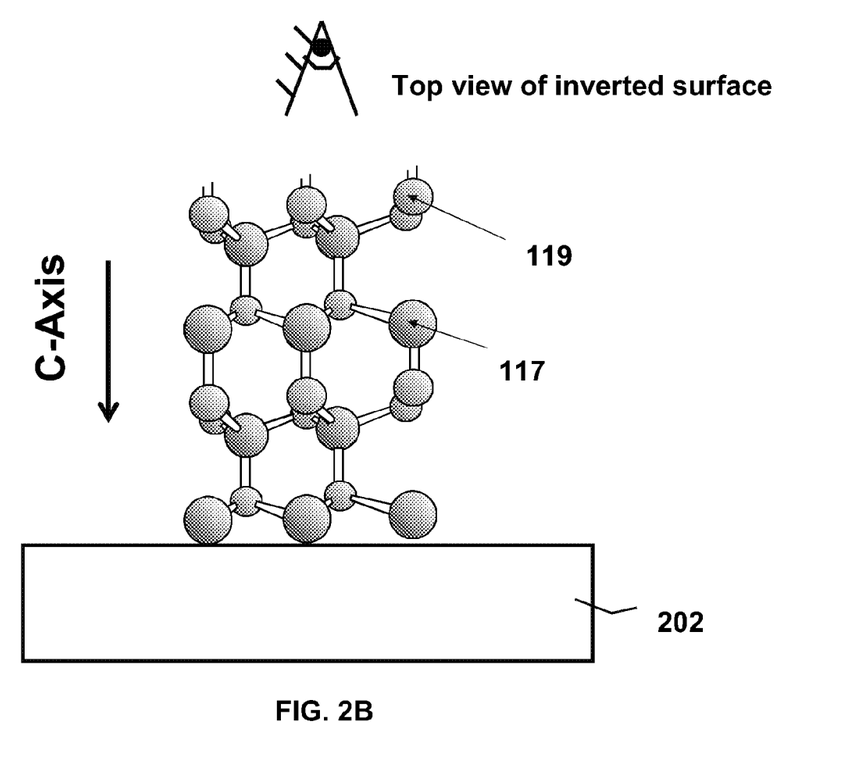
FIG. 2B illustrates an example crystal structure of a Nu n-doped GaN layer, in accordance with an embodiment of the present invention.

In some cases, it may be beneficial to form semiconductor structures using processes that result in crystal structures with inverted configuration of atomic bonds along the c-axis of the crystal structure (in the direction towards the surface) between Ga and N atoms. The inverted configuration of atomic bonds is realized by removing the original substrate (c-plane sapphire, c-plane SiC) and exposed the inverted surface; this inverted surface is shown in FIG. 2B. For example, such structures may be formed when fabricating a vertical LED structure, as described in U.S. patent application Ser. No. 11/032,882, filed Jan. 11, 2005 and herein incorporated by reference in its entirety. As described therein, Vertical LED devices (VLEDs) may have many advantages, for example, better thermal dissipation, better current distribution, higher efficiency.

Figure 4A:
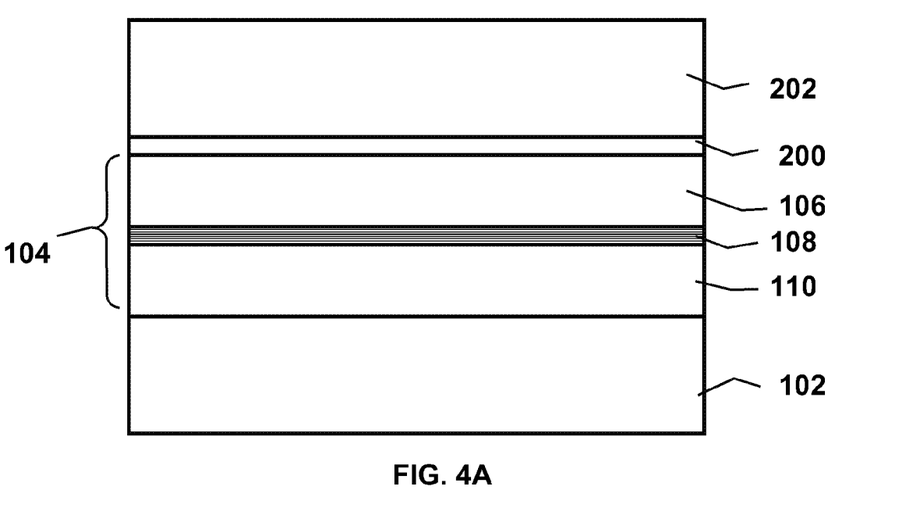
FIGS. 4A-4C illustrate different stages of fabricating a vertical LED structure, showing the creation of the Nu n-doped GaN surface.
Figure 4B:
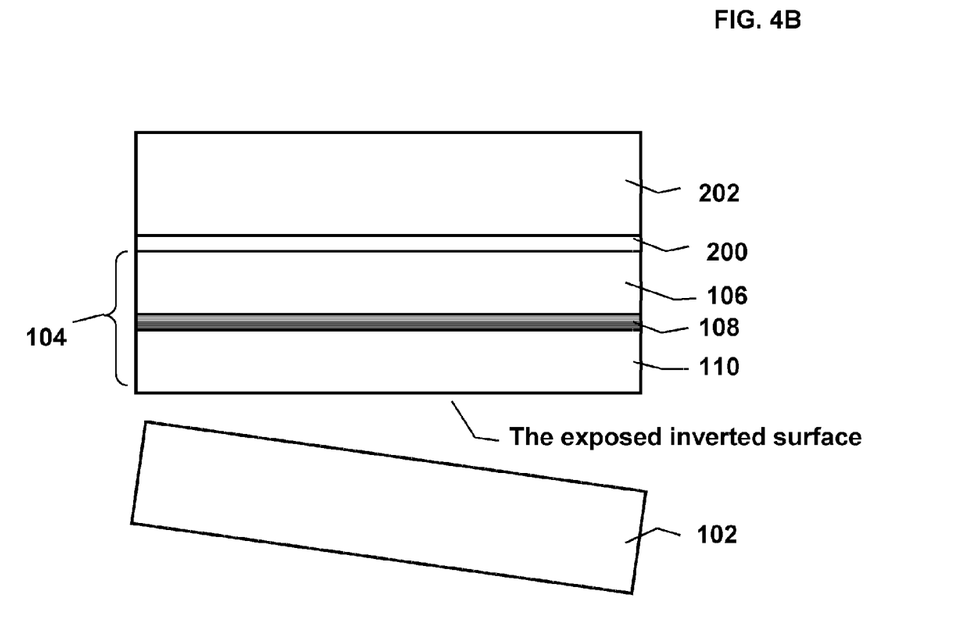
Figure 4C:
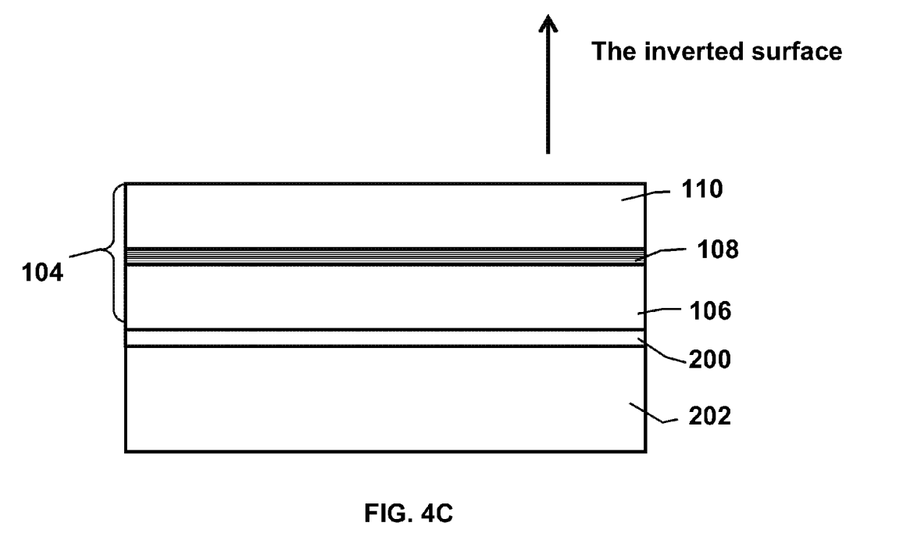

As illustrated in FIG. 4A, in the VLED fabrication process, a reflective surface 200 and metal substrate 202 may be deposited or bonded on top of as deposited Gallium terminated p doped-GaN surface. The carrier substrate 102 (for example c-plane sapphire, c-plane SiC,) may be removed from the structure leaving behind and exposing the GaN that was in contact with the carrier substrate as shown in FIG. 4B. Referring ahead to FIG. 4C, the VLED structured with the carrier substrate 102 removed has the exposed layer 106 GaN facing up. The corresponding crystal structure is shown in FIG. 2B, with the atomic bond between Nitrogen atoms 119 and the Gallium atoms 117 in inverted configuration compared to that shown in FIG. 2A.

As a result, this new created GaN surface/inverted surface may exhibit very different properties with respect to the as-deposited GaN surface shown in FIG. 2A due to a mirrored configuration of Nitrogen and Ga atoms. In the present application, this newly created n-doped GaN layer having a surface exposed by removing a substrate on which the GaN layer was formed, will be referred to herein as an Nu-GaN layer. This exposed surface could be treated by mechanical or chemical means, for examples: wet etching, dry etching, polishing, and/or lapping.

The spontaneous polarization at the Nu n-doped GaN surface has an opposite direction compared to that of conventional as deposited GaN surface. The Nu-GaN is a man-made surface (e.g., resulting from removing a deposition substrate) and the crystal structure of such a Nu-GaN surface may be less stable than as deposited GaN surface, wherein stability refers to the uniformity of contact resistance when forming contacts. As a result, forming low resistance electrical contacts on Nu-GaN is not well known. In conventional LED technology, the metallization techniques for as-deposited n-doped or p-doped GaN layers are well understood, but metallization techniques for Nu-GaN is not well understood. For VLED, the contact to p electrode is contacted to conventional p-doped GaN layer surface, but the n-electrode may have to make contact to Nu-n-doped GaN layer and it is important to have a low resistance and stable contact for Nu-n-doped GaN for reliable VLED devices.

Accordingly, what is needed is technique for forming a contact for interfacing with a Nu n-doped GaN semiconductor layer that provides low and stable resistance.

SUMMARY OF THE INVENTION

Embodiments of the present invention generally provide techniques for forming low resistant contacts for inverted n-doped GaN surface called Nu n-doped GaN surfaces.

One embodiment of the invention provides a semiconductor device. The device generally includes a layer of a gallium nitride (GaN) material having Nu n-doped GaN man-made surface/inverted GaN surface and a metal making contact with inverted GaN surface to provide electrical coupling to the layer.

One embodiment of the invention provides a light emitting diode (LED) device. The device generally includes a layer of a n-doped gallium nitride (GaN) material having an inverted surface in contact with a metal as part of a n-electrode, a layer of a p-doped gallium nitride (GaN) having as deposited surface in contact with a metal as part of a p-elctrode, a multi-quantum well structure between the n-doped and p-doped GaN layers, and an n-electrode metal making contact with the inverted n-doped GaN layer to provide electrical coupling to the layer.

One embodiment of the invention provides a method of fabricating a vertical light-emitting diode (VLED) structure. The method generally includes forming, above a carrier substrate, a light-emitting diode (LED) stack comprising at least one n-doped GaN layer and at least one p-doped GaN layer separated by a multi-quantum well layer, depositing one or more layers of a metal substrate above the LED stack, removing the sapphire substrate, and forming a metal contact on inverted n-doped GaN surface and forming a metal contact on as-deposited p-doped GaN,

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention generally provide techniques for forming a contact on an n-doped GaN layer having a surface exposed by removing a substrate on which the n-doped GaN layer was formed (referred to herein as a Nu n-doped GaN layer). The techniques are described with reference to fabrication of a vertical light-emitting diode (VLED) is described below as a specific, but not limiting, example. However, those skilled in the art will recognize that the techniques may be applied to a wide variety of semiconductor devices having an inverted configuration as such of Nu-GaN layer intended to be coupled with an electrically conductive contact.

An Exemplary Contact Fabrication Method

Referring now to FIG. 4C, with the carrier substrate 102 removed, the device may be flipped over, with the exposed n-GaN layer 106 facing up. As a result, the n-GaN layer now has a Nu-surface. The corresponding crystal structure is shown in FIG. 2B, with the Nitrogen atoms 119 facing the surface and the Gallium atoms 117 below.

Figure 5:
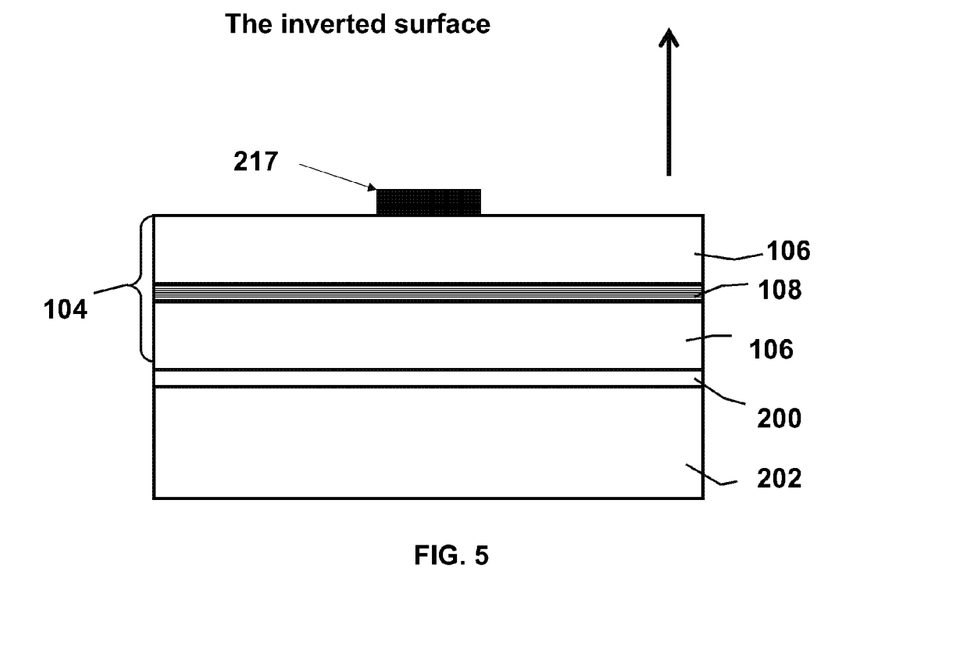
FIG. 5 illustrates the structure of FIG. 4C with a contact formed thereon, in accordance with an embodiment of the present invention.

Referring now to FIG. 5, a contact pad 217 for external connection to the n-doped layer 106 may be formed. The contact pad 217 may be fabricated using one of the materials or combinations of materials described below in an effort to achieve a high reliability contact with low resistance, despite the relatively unstable crystal structure of a Nu n-GaN surface.

The VLED devices structure FIG. 4C has Nu-n doped-GaN on the top. The Nu-n doped-GaN has unstable crystal structure, and very reactive. The spontaneous polarization at the Nu n-doped GaN surface has an opposite direction compared to that of conventional as deposited GaN surface. Therefore, conventional metal contact materials, such as Ni, Pd, Cr, Ti used for conventional LED with as deposited GaN surface may not perform well for VLED Nu n-doped GaN surface.

Techniques provided herein, however, may allow the formation of a low resistance contact, a stable, low resistance contact metal structure to lower the forward voltage ($V_F$) for obtaining high power efficiency, and better reliability. As used herein, the term Low resistance contact generally refers to a contact having less than $5\times10^{-2}$ ohm-cm$^2$, preferably with less than $5\times10^{-5}$ ohm-cm$^2$. As used herein, the term stable when referring to contact resistance generally refers to less than 10% variation during operation, preferably less than 5% variation.

Embodiments of the present invention may take advantage of the low work function of Al, or Al-based alloys, such as AlTi, AlSi, AlCu, AlNi to achieve a low resistance and stable contact with Nu-n-GaN surface. Using Aluminum or Aluminum alloys as the contact material to NT n-doped GaN to make low resistance and stable contact many metal structures, such as Al/Ni/Au, AlTi/Ni/Au, Al/Pt/Au, Al/TaN/Au, AlTi/Pt/Au, AlTi/TaN/Au, AlSi/Ni/Au, AlSi/Pt/Au, AlSi/TaN/Au, AlCu/Ni/Au, AlCu/Pt/Au, AlCu/TaN/Au, metal structures may been used successfully.

For some embodiments, other low work function metals, such as Sn, Zn, Mg, Hf, W, Ta, Co, Vd, Mo and their alloys may be used for fabricating low resistance and stable contact with Nu n doped-GaN. Using Sn, Zn, Mg, Hf, W, Ta, Co, Vd, Mo or their alloys as contact material to NT n-doped GaN to make low resistance and stable contact, many metal structures such as Sn/Ni/Au, Sn/TaN/Au, Sn/Pt/Au, Zn/Ni/Au, Zn/TaN/Au, Zn/Pt/Au, Mg/Ni/Au, Mg/TaN/Au, Mg/Pt/Au, Hf/Ni/Au, Hf/TaN/Au, Hf/Pt/Au, W/Au, W/Ni/Au, W/Pt/Au, Ta/Ni/Au, Co/Ni/Au, or its alloy may be used to fabricate VLED having Nu n-doped GaN.

There may be a number of advantages to a lower resistance contacts formed herein. For example, low resistance contacts to Nu-GaN (whether undoped GaN, n-GaN, and/or p-GaN) may result in better power efficiency and improved reliability. While these advantages apply to VLED devices, those skilled in the art will recognize that such advantages generally apply to most semiconductor devices. Therefore, the techniques described herein may be used to advantage to form low resistance contacts for any type of semiconductor device having a nitrogen-terminated surface.

While the foregoing is directed to embodiments of the present invention, other and further embodiments of the invention may be devised without departing from the basic scope thereof, and the scope thereof is determined by the claims that follow.

The invention claimed is:

1. A method of fabricating a vertical light-emitting diode (VLED) structure, comprising:
   forming, above a carrier substrate, a light-emitting diode (LED) stack comprising at least one n-doped GaN layer and at least one p-doped GaN layer separated by a multi-quantum well layer;
   depositing one or more layers of a metal substrate above the LED stack;
   removing the carrier substrate to expose a nitrogen-terminated surface of the n-doped GaN layer; and
   depositing aluminum (Al) or an Al-based alloy on the exposed nitrogen-terminated surface to form a metal contact such that the Al or the Al-based alloy contacts the nitrogen-terminated surface.

2. The method of claim 1, wherein the metal contact comprises at least one of AlTi, AlSi, AlCu, AlNi, and alloys thereof.

3. A method of fabricating a vertical light-emitting diode (VLED) structure, comprising:
- forming, above a carrier substrate, a light-emitting diode (LED) stack comprising at least one n-doped GaN layer and at least one p-doped GaN layer separated by a multi-quantum well layer;
- depositing one or more layers of a metal substrate above the LED stack;
- removing the carrier substrate to expose a nitrogen-terminated surface of the n-doped GaN layer;
- forming a metal contact having a first layer comprising at least one of Sn, Zn, Mg, Co, V, Hf, W, Ta, and alloys thereof on the exposed nitrogen-terminated surface such that the at least one of Sn, Zn, Mg, Co, V, Hf, W, Ta, and alloys thereof contacts the nitrogen-terminated surface, and a second layer disposed above the first layer and comprising at least one of Pt, Ni, and TaN.

4. The method of claim 3, wherein the metal contact comprises at least one of Sn/Ni/Au, Sn/TaN/Au, Sn/Pt/Au, Zn/Ni/Au, Zn/TaN/Au, Zn/Pt/Au, Mg/Ni/Au, Mg/TaN/Au, Mg/Pt/Au, Hf/Ni/Au, Hf/TaN/Au, Hf/Pt/Au, W/Ni/Au, W/Pt/Au, Ta/Ni/Au, or Co/Ni/Au.

5. The method of claim 3, wherein the metal contact has a resistance less than $5 \times 10^{-5}$ ohm-cm$^2$.

6. The method of claim 1, wherein the metal contact comprises at least one of Al/Ni/Au, AlTi/Ni/Au, Al/Pt/Au, Al/TaN/Au, AlTi/Pt/Au, AlTi/TaN/Au, AlSi/Ni/Au, AlSi/Pt/Au, AlSi/TaN/Au, AlCu/Ni/Au, AlCu/Pt/Au, or AlCu/TaN/Au.

7. The method of claim 1, wherein the metal contact has a resistance less than $5 \times 10^{-5}$ ohm-cm$^2$.

8. A method of fabricating a semiconductor structure, comprising:
- forming, above a first substrate, a semiconductor stack comprising at least one n-doped GaN layer and at least one p-doped GaN layer;
- depositing one or more layers of a second substrate above the semiconductor stack;
- removing the first substrate to expose a nitrogen-terminated surface of the n-doped GaN layer; and
- depositing aluminum (Al) or an Al-based alloy on the exposed nitrogen-terminated surface to form a metal contact such that the Al or the Al-based alloy contacts the nitrogen-terminated surface.

9. The method of claim 8, wherein the metal contact comprises at least one of AlTi, AlSi, AlCu, AlNi, and alloys thereof.

10. The method of claim 8, wherein the metal contact comprises at least one of Al/Ni/Au, AlTi/Ni/Au, Al/Pt/Au, Al/TaN/Au, AlTi/Pt/Au, AlTi/TaN/Au, AlSi/Ni/Au, AlSi/Pt/Au, AlSi/TaN/Au, AlCu/Ni/Au, AlCu/Pt/Au, or AlCu/TaN/Au.

11. The method of claim 8, wherein the second substrate comprises a metal substrate.

12. The method of claim 8, wherein the metal contact has a resistance less than $5 \times 10^{-5}$ ohm-cm$^2$.

* * * * *